United States Patent [19]

Marchesi et al.

[11] Patent Number: 5,357,217
[45] Date of Patent: Oct. 18, 1994

[54] SIGNALS GENERATOR HAVING NON-OVERLAPPING PHASES AND HIGH FREQUENCY

[75] Inventors: Gianmarco Marchesi, Rivergaro; Guido Torelli, Alessio, both of Italy

[73] Assignee: SGS-Thomson Microelectronics, S.r.l., Agrate Brianza, Italy

[21] Appl. No.: 62,468

[22] Filed: May 13, 1993

[30] Foreign Application Priority Data

May 15, 1992 [EP] European Pat. Off. ........ 92830230.6

[51] Int. Cl.$^5$ ............................................. H03B 27/00
[52] U.S. Cl. .................................. 331/57; 331/46; 331/55; 331/74; 331/172; 307/296.2; 363/60
[58] Field of Search ............... 331/46, 57, 55, 56, 331/53, 108 R, 172, 74, 75, DIG. 3, 185; 328/20; 377/47, 72, 74; 307/296.1, 296.2, 269; 363/59, 60, 61

[56] References Cited

U.S. PATENT DOCUMENTS

| | | | |
|---|---|---|---|
| 4,025,874 | 5/1977 | Abbey | 331/55 |
| 4,105,950 | 8/1978 | Dingwall | 331/57 |
| 4,560,954 | 12/1985 | Leach | 331/108 B |
| 4,933,827 | 6/1990 | Olivo et al. | 363/60 |
| 4,970,409 | 11/1990 | Wada et al. | 307/296.1 |
| 5,029,063 | 7/1991 | Lingstaedt et al. | 363/60 |
| 5,043,858 | 8/1991 | Watanabe | 363/61 |
| 5,086,236 | 2/1992 | Feemster | 307/269 |
| 5,093,586 | 3/1992 | Asari | 307/296.1 |
| 5,097,226 | 3/1992 | Pascucci et al. | 331/46 |
| 5,184,030 | 2/1993 | Chung et al. | 307/296.1 |
| 5,264,808 | 11/1993 | Tanaka | 331/57 |
| 5,280,420 | 1/1994 | Rapp | 363/60 |

FOREIGN PATENT DOCUMENTS

0238874 9/1987 European Pat. Off. .

OTHER PUBLICATIONS

"CMOS On-Chip Starter Circuit for Substrate Bias Generator", IBM Technical Disclosure Bulletin, vol. 28, No. 9, Feb. 1986.
"Digital High Frequency Doubler Circuit" by S. W. Roach, IBM Technical Disclosure Bulletin, vol. 25, No. 3A, Aug. 1982.
Nuclear Instruments and Methods, vol. 108, 1973 North–Holland Publishing Co., Amsterdam NL pp. 375–376 F. May et al., "Zeitschaltungen mit Cosmos–Bausteinen, I".

*Primary Examiner*—David Mis
*Assistant Examiner*—Arnold Kinkead
*Attorney, Agent, or Firm*—Robert Groover

[57] ABSTRACT

A signal generator which includes two matched ring oscillators, and feedback gates which cross-couple each ring oscillator to the other. That is, in each oscillator, a first node gates a coupling transistor which connects a second node (complementary to the first node) across to drive the first node of the other oscillator.

28 Claims, 3 Drawing Sheets

SIGNALS GENERATOR HAVING NON-OVERLAPPING PHASES AND HIGH FREQUENCY

CROSS-REFERENCE TO RELATED APPLICATION

This application claims priority from EPC App'n 92830230.6, filed May 15, 1992, which is hereby incorporated by reference.

BACKGROUND AND SUMMARY OF THE INVENTION

This invention relates to non-overlapping two-phase, signal generators useful in integrated circuits for very high frequency applications (i.e. at frequencies lying close to the upper limit allowed by the integration technology), and particularly to such generators in combination with voltage multiplier circuits, especially in CMOS-type memory devices.

There are many applications which require the availability of non-overlapping two-phase digital signals (i.e. signals having a near-square waveform and a "non-overlap" characteristic such that the signals have equal frequency and are substantially in phase opposition).

A perfectly square waveform (with perfectly vertical edges) is not obtainable in a real physical circuit. However, to attain high operating frequencies in a digital circuit, steep edges of the waveform are desirable.

Two iso-frequential signals $\Phi 1$ and $\Phi 2$, substantially in phase opposition and having near-square waveforms, can be obtained conventionally using a loop oscillator consisting of an odd number of cascaded inverters. If the outputs from two inverters adjacent to each other are taken to drive the set (S) and reset (R) inputs of a set-reset type of flip-flop such that the output signals are both zero (inactive) when the set and reset inputs are both one (active), then the output signals from the flip-flop $(Q,Q\backslash)$ will fill the above requirements. In tact, each output, Q and $Q\backslash$, can only switch from a logic level of 0 to a logic level of 1 after the other output has attained a logic level of 0.

Alternatively, the output of just one of the loop inverters may be taken and the flip-flop driven with that signal and its complement (obtained therefrom by means of an inverter).

In either case, the oscillation period, and hence the repetition period of the generated signals, will be equal to the sum total of the switch times of the oscillator inverters.

Where the phase "non-overlap" time is to be increased, an even (and normally equal) number of inverters may be connected in each of the two positive feedback paths of the flip-flop. This is conventionally implemented, for example, with two logic gates of the NOR type.

However, where a very high signal frequency is sought, the number of the inverters comprising the loop oscillator should be quite small. In the extreme, a loop formed of as few as three inverters could be used, with each inverter comprising transistors of small dimensions in order to minimize the switch times.

In this case, the switch times for the available signals at the various nodes in the loop, and those required by the logic gates which make up the flip-flop, are not negligible compared to oscillation period (as is the case, instead, with a large number of stages in the loop). The two signals Q and $Q\backslash$ would therefore be active for an extremely short time; and as a result, they may be unable to adequately drive the circuit for which they have been generated.

A very high signal frequency is desirable where the non-overlapping phase signals are used, as mentioned, to drive a voltage multiplier device which is to afford high output current capabilities; the deliverable current (for a given capacitor and transistor sizing) being directly proportional to the frequency of the drive signals.

Voltage multiplier circuits are also employed in non-volatile integrated memories for write and erase functions. Floating-gate memories (such as EPROMs, EEPROMs, or flash EPROMs) normally require voltages well above 5V for programmation of the cells. (Voltage multiplier circuits use charge pumping through capacitors to achieve a voltage which is higher than the supply voltage.)

In the instance of non-overlapping two-phase signals operating at the limits allowed by the integration technology, a very small overlap in the signal active phases, and less-than-true "verticality" of the rising and falling edges, may be acceptable if the active phase times are sufficient.

It is an object of this invention to provide a non-overlapping phase signal generator which exhibits, when compared to prior art generators, improved "non-overlap of phases" at the highest frequencies, without involving any substantial reduction in the active phase times.

A further object of the invention is to ensure proper operation of the non-overlapping phase signal generator at the highest frequencies irrespective of the technology employed for its integration.

These objects are achieved by a signal generator which includes two feedback gates which cross-couple each ring oscillator to the other. That is, in each oscillator, a first node gates a coupling transistor which connects a second node (complementary to the first node) across to drive the first node of the other oscillator.

For example, in FIG. 1, the non-overlapping-phase signal generator comprises first and second loop oscillators (O1 ,O2) including cascaded inverters. Defined in each cascade of inverters are first and second circuit nodes between the inverters. Between the first node (2) of the first oscillator (O1) and the second node (3A) of the second oscillator, there is connected a transistor having a control terminal connected to the first node of the second oscillator. Connected between the first node (2A) of the second oscillator (O2) and the second node (3) of the first oscillator is a transistor having a control terminal connected to the first node of the first oscillator (O1).

According to the innovative teachings set forth herein, there is provided: an integrated circuit for generating non-overlapping complementary clock signals, comprising: first and second mutually matched ring oscillators, each comprising an odd number of inverting digital gates connected in a loop, at least one of the inverting gates of each the oscillator being connected to be driven by a first node of the oscillator and configured to drive a second node of the oscillator in opposition to the first node; a first switch connected to be driven by the first node of the first oscillator, and connected so that the second node of the first oscillator is connected to the first node of the second oscillator when the first transistor is turned on; and a second switch connected to be driven by the first node of the second oscillator, and connected so that the second node of the second oscillator is connected to the first node of the first oscillator when the second transistor is turned on; wherein at least one node of the first oscillator is connected to provide a first clock signal, and the corresponding node of the second oscillator is connected to provide a second clock signal which does not overlap with the first clock signal.

According to the innovative teachings set forth herein, there is also provided: a CMOS integrated circuit for generating non-overlapping complementary clock signals, comprising: first and second mutually matched ring oscillators, each comprising an odd number of inverting digital gates connected in a loop, at least one of the inverting gates of each the oscillator consisting of a simple CMOS inverter which is connected to be driven by a first node of the oscillator and configured to drive a second node of the oscillator in opposition to the first node; at least one first NMOS coupling transistor connected to be driven by the first node of the first oscillator, and connected so that the second node of the first oscillator is connected to the first node of the second oscillator when the first transistor is turned on; and a second NMOS coupling transistor connected to be driven by the first node of the second oscillator, and connected so that the second node of the second oscillator is connected to the first node of the first oscillator when the second transistor is turned on; wherein at least one node of the first oscillator is connected to provide a first clock signal, and the corresponding node of the second oscillator is connected to provide a second clock signal which does not overlap with the first clock signal.

According to the innovative teachings set forth herein, there is also provided: an integrated circuit on-chip high-voltage generator, comprising: a voltage multiplier circuit, including two or more switches connected to be driven by first and second non-overlapping clock signals, and one or more capacitors interconnected with the switches to effect charge pumping; and a clock generation circuit comprising: first and second mutually matched ring oscillators, each comprising an odd number of inverting digital gates connected in a loop, at least one of the inverting gates of each the oscillator being connected to be driven by a first node of the oscillator and configured to drive a second node of the oscillator in opposition to the first node; a first coupling transistor connected to be driven by the first node of the first oscillator, and connected so that the second node of the first oscillator is connected to the first node of the second oscillator when the first transistor is turned on; and a second coupling transistor connected to be driven by the first node of the second oscillator, and connected so that the second node of the second oscillator is connected to the first node of the first oscillator when the second transistor is turned on; wherein at least one node of the first oscillator is connected to provide the first clock signal, and the corresponding node of the second oscillator is connected to provide the second clock signal.

According to the innovative teachings set forth herein, there is also provided: a non-overlapping phase, signal generator circuit comprising: at least first and second loop oscillator circuits with cascaded inverters, each the oscillator circuit having first and second circuit nodes with at least one of the inverters connected therebetween, and at least first and second switch circuit means, each having first and second terminals and a control terminal, the first switch circuit means being connected with its first and second terminals between the first circuit node of the first oscillator circuit and the second circuit node of the second oscillator circuit, the second switch circuit means being connected with its first and second terminals between the second circuit node of the first oscillator circuit and the first circuit node of the second oscillator circuit, the control terminal of the first switch circuit means and the control terminal of the second switch circuit means being respectively coupled to the first circuit node of the second oscillator circuit and the first circuit node of the first oscillator circuit.

According to the innovative teachings set forth herein, there is also provided: a non-overlapping phase, signal generator circuit comprising: at least first and second loop oscillators and at least first and second switch circuit means having control terminals respectively coupled to a first point in the signal path of the second loop oscillator and a first point in the signal path of the first loop oscillator, the second switch means being connected between the first point in the signal path of the second loop oscillator and a second point in the signal path of the first loop oscillator, whereat a signal has a different phase from the phase it has at the first point in the signal path of the first loop oscillator, the first switch means being connected between the first point in the signal path of the first loop oscillator and a second point in the signal path of the second loop oscillator, whereat a signal has a different phase from the phase it has at the first point in the signal path of the second loop oscillator.

The features and advantages of a non-overlapping two-phase signal generator according to the invention will become apparent from the following detailed description of an embodiment thereof, given by way of example and not of limitation with reference to the accompanying drawings.

BRIEF DESCRIPTION OF THE DRAWINGS

The present invention will be described with reference to the accompanying drawings, which show important sample embodiments of the invention and which are incorporated in the specification hereof by reference, wherein.

DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Figure 1:
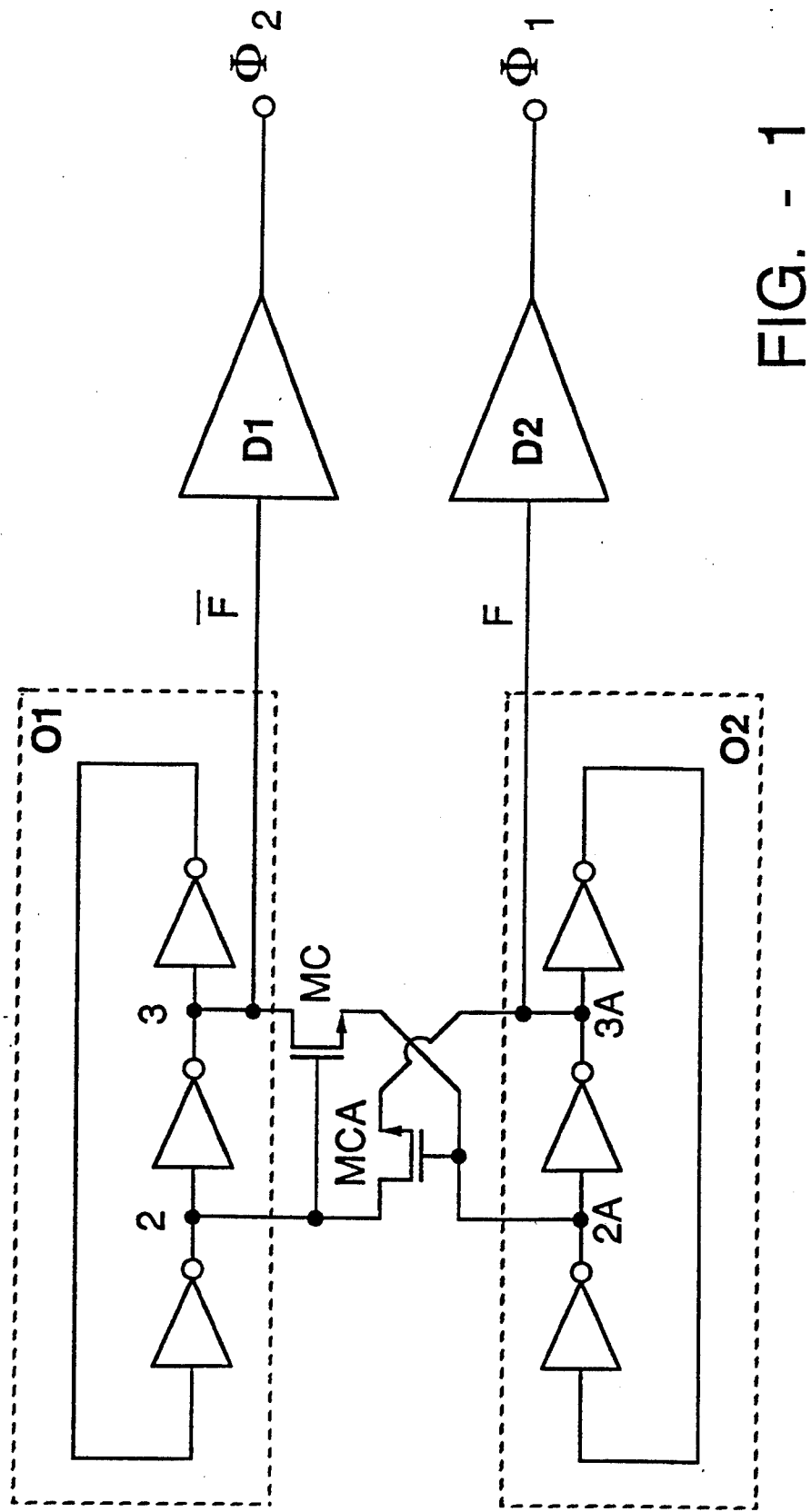
FIG. 1 is a diagram, partly in block form, of a non-overlapping phase signal generator according to the invention.

The circuit embodiment of a non-overlapping phase signal generator according to the invention comprises, as shown in FIG. 1, two paired oscillators Q1 and Q2 substantially identical with each other (both in their circuit pattern and in their corresponding components and integration layout). In this embodiment, each oscillator comprises three inverters connected in a loop, whereby the two oscillators have a very high frequency of oscillation if the inverters are suitably dimensioned.

Of course, solutions are also possible which employ a larger number of inverters in each loop.

The two oscillators, which have ideally the same frequency of oscillation, are operated in phase opposition. For this purpose, a control device is provided according to the invention which can maintain the phase difference between the two oscillators at 180°, and drive it to this value if found different.

Connected between the two loop oscillators are two field-effect transistors (CMOS in the embodiment shown). These transistors function as a switch actuated automatically by the polarity condition of the signal in the loops of the two oscillators.

In the embodiment shown of oscillators having three cascaded inverters, a first coupling transistor MC has its gate terminal connected to a circuit node 2 between the first inverter and the second inverter of oscillator O1, and is connected with its source and drain terminals between a circuit node 3, across the second and third inverters of oscillator O1, and a first circuit node 2A, across the first and second inverters of oscillator O2.

A second coupling transistor MCA has its gate terminal connected to the circuit node 2A and is connected with its source and drain terminals between the circuit node 2 and a second circuit node 3A, across the second and third inverters of the second oscillator O2.

The two nodes 3 and 3A constitute the two signal outputs F\ and F.

The signals being output generally are not applied to a load directly, but rather through suitable circuits, commonly referred to as drivers in the pertinent literature.

The principle on which a generator according to the invention operates will be now described.

In normal operation of the oscillators, as the voltage on node 2 becomes high, the voltage on node 3 becomes low; accordingly, the transistor MC will be turned on and bring the voltage on node 2A to a low, should the latter not be low already.

A similar function (driving the node 2 to a voltage low as the voltage on the node 2A is at a high) is served by transistor MCA.

The waveforms of the voltages present on the nodes 2 and 2A, and hence those for the nodes 3 and 3A, which represent the outputs F\ and F of the two oscillators, are therefore held in phase opposition, or else driven to this condition, as desired.

Thus, two high-frequency signals can be generated which have substantially non-overlapping complementary waveforms.

Phase control of the output signals from both oscillators is very good even in the presence of a mismatch (as may exist within an integrated circuit) between corresponding elements of the two oscillators. Thus, the oscillation frequencies of the paired oscillators will be the same even in the presence of such mismatches, so that the waveforms generated by both oscillators can be iso-frequential and substantially non-overlapping.

The two blocks denoted by the references D1 and D2 (drivers which may be either inverting or non-inverting) serve, as mentioned, the function of driving the load circuit, and may be embodied in any conventional manner. In fact, to attain a high frequency of operation, the transistors used in the two oscillators generally have small dimensions, and cannot directly drive more than a modest load capacitance. The driver blocks are effective to minimize the capacitive load actually present on the oscillator outputs (F\ and F), and to match the latter to the input capacitances of the circuit to be driven, thereby optimizing the oscillator operation and minimizing the switch times for the signals which drive the load circuit. Of course, the two blocks D1 and D2 should be substantially identical with each other (both circuit-wise and as far as the corresponding components and the integrated circuit layout are concerned) to ensure identical paths for the two complementary signals.

Figure 2:
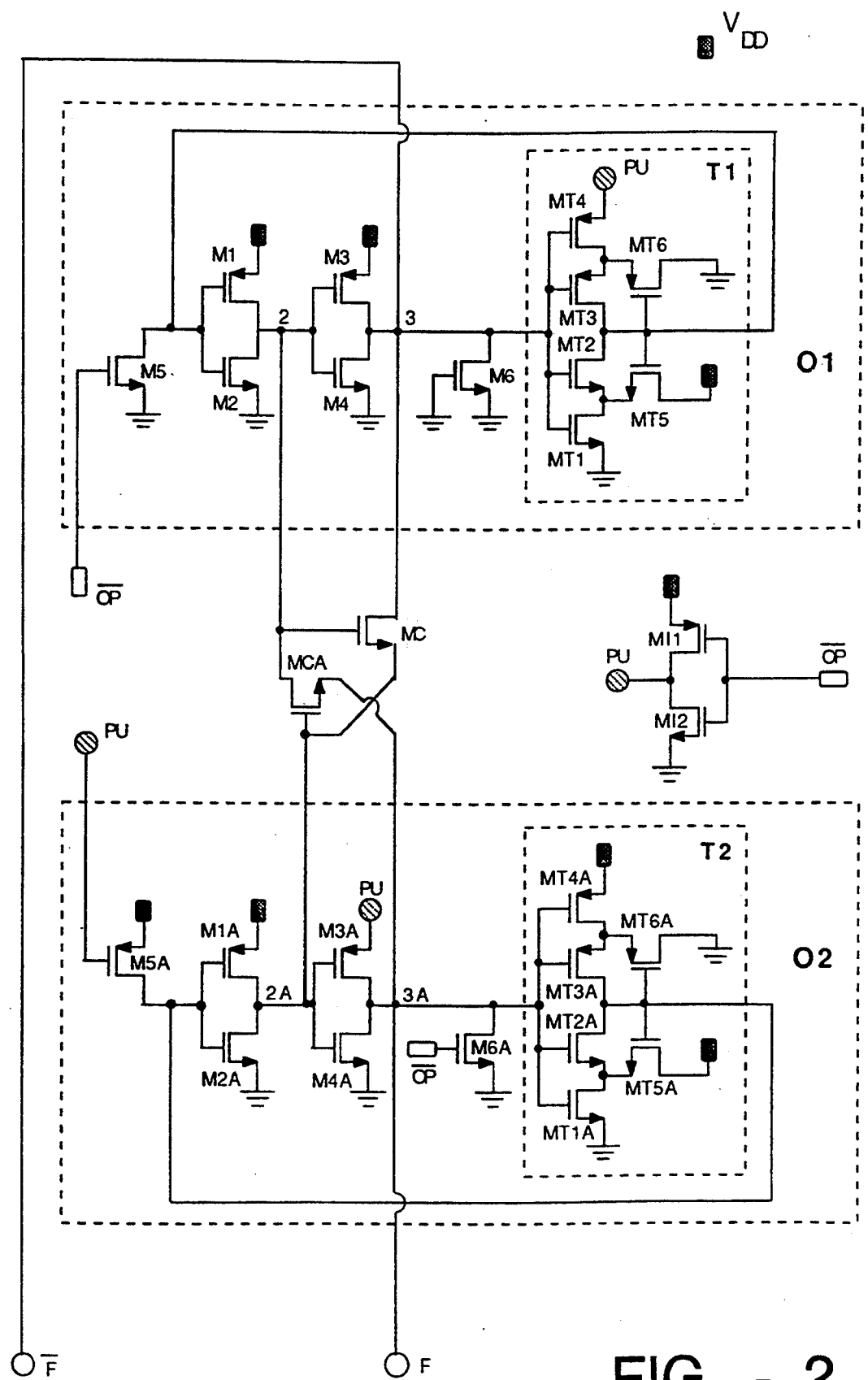
FIG. 2 shows a sample CMOS implementation of the circuit of FIG. 1.

A circuit pattern that embodies the generator proposed herein is illustrated by FIG. 2. In this embodiment, each oscillator has one of the inverting elements implemented by a Schmitt trigger (blocks T1 and T2, of conventional construction), to thereby make triggering more reliable (by virtue of the high voltage gain afforded by this circuit block within its switch voltage range) and achieve improved stability of the oscillation frequency.

As for the construction of the drivers, it is well known in this field that for a satisfactory matching of a digital circuit output to a capacitive load, the interposition of a cascade of inverters between the output and the load becomes advisable; the number of the cascade-connected inverters should be selected suitably (the optimum number thereof being selected each time by the designer, contingent on specific applications), and each inverter should have larger dimensions than the preceding one.

The final stage in the driver may comprise several inverters identical with one another, each arranged to drive a portion of the load circuit separately.

For driving very small loads, the driver may comprise a simple inverter or even be omitted altogether and replaced with a short-circuit; in this case the two paired oscillators would drive the load circuit directly.

The circuit shown in FIG. 2 lends itself for use in applications aimed at substantially no power draw when the signals with two non-overlapping phases are not to be used. For this purpose, the circuit includes a means to cut off supply voltage when the generated signals are not needed.

The inputs of both oscillators are held respectively blocked by two transistors M5 (oscillator O1) and M5A (oscillator O2). In order to have substantially no static current draw, the oscillation voltage of the third inverter (Schmitt trigger) in oscillator O1 and of the second inverter in oscillator O2 is cut off, and the node 3A in oscillator O2 is held at ground level. The supply voltage to the two inverters just named is cut off by having the source electrodes of transistors MT4 and M3A connected, instead of to VDD, to the pole PU which is the output of the inverter formed by MI1 and MI2 and is driven by an external signal OP\; the node 3A being held at ground level through a transistor M6A.

A transistor M6 is connected in the oscillator O1 to improve matching of the two oscillators (although this is not strictly necessary).

Upon the signal OP\ becoming low, the oscillation loops are activated, and the two oscillators generate the required output signals. (The waveforms of both signals are, of course, the same as those sought, after expiration of a short startup period.)

The external control signal OP \ is, for example, a signal that would be generated automatically in a floating-gate memory during non-write and non-erase phases, that is, when no high write voltage from the voltage boost is required (and thus no output from the non-overlapping phase signal generator is required).

Thus, a major advantage of the non-overlapping phase signal generating circuit according to the invention is that two standard paired oscillators, substantially identical with each other, can be driven at the desired phases by the sole use of a pair of transistors.

The simplicity of such a circuit avoids deterioration in the performance of the two oscillators, even at the highest frequencies.

An additional advantage is that the signal active phase times can be optimized without using flip-flops.

In a sample embodiment, the designed W/L geometries of the devices, in microns, are as follows:

| | |
|---|---|
| M1 W/L ($\mu$m): | 10/0.9 |
| M2: | 4/0.8 |
| M3: | 20/0.9 |
| M4: | 8/0.8 |
| M5: | 4/0.8 |
| M6: | 4/0.8 |

Figure 3:
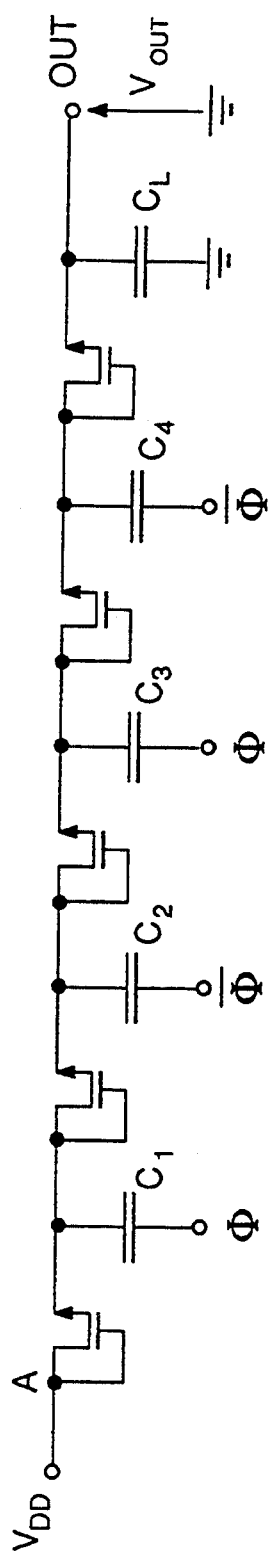
FIG. 3 shows an example of a voltage multiplier circuit for use with the signal generator of FIG. 1.

FIG. 3 shows an example of a voltage multiplier circuit for use with the signal generator of FIG. 1. (Of course, a wide variety of other known voltage multiplier circuit configurations may alternatively be substituted.) This combination of circuits provides a high-frequency drive to the multiplier (and hence, with appropriately sized switching transistors, maximal output current from the multiplier), while also preventing any unnecessary power dissipation.

In FIG. 3, the two clock signals $\Phi$ (or $\Phi_1$) and $\Phi \setminus$ (or $\Phi_2$) are conventionally connected, through capacitors, to alternate nodes of a diode string. (In the example shown, $\Phi$ is connected through capacitors $C_1$ and $C^3$, and $\Phi \setminus$ is connected through capacitors $C_2$ and $C_4$.) The effect of this, as is well known, is to produce a charge-pumping action: when $\Phi$ is low, diode $D_1$ will pass current to bring node A up to about $V_{DD}-V_T$. When $\Phi$ goes high again, coupling through the capacitor $C_1$ will tend to increase the voltage of node A by about $V_{DD}-V_{C1}$ (where $V_{C1}$, the voltage drop across the capacitor $C_1$, depends, among other factors, on the size of the capacitor $C_1$, the parasitic capacitance of node A, and the load and leakage currents drawn from node A). Thus, when $\Phi$ is high and $\Phi$ is low forward conduction through diode $D_2$ will tend to pull node B towards a voltage of about $2V_{DD}-2V_T-V_{C1}$. Similar pumping effects will provide successively higher voltages at nodes C, D, and E (as long as the device breakdown voltages are not exceeded). The number of nodes used, and the size of the capacitors, is determined by the required output voltage and load current.

This simple circuit is easily integrated in a CMOS process. However, the disclosed innovations can also be advantageously applied to many other known circuit designs for voltage multipliers.

FURTHER MODIFICATIONS AND VARIATIONS

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

For example, the connections to signals PU and OP \, and many other specific features of the circuit configuration of FIG. 2, can be widely varied.

For another example, the coupling transistors could alternatively be configured using PMOS transistors rather than NMOS transistors, or using a more complex gate (with appropriate adjustment to the other circuit elements). However, these alternatives are generally less preferable, since the simple NMOS transistor shown minimizes additional loading while providing adequate drive.

For another example, the disclosed circuit can also (alternatively) be implemented in technologies other than CMOS.

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. An integrated circuit for generating non-overlapping complementary clock signals, comprising:
    first and second mutually matched ring oscillators, each comprising an odd number of inverting digital gates connected in a loop, at least one of said inverting gates of each said oscillator being connected to be driven by a first node of said oscillator and configured to drive a second node of said oscillator in opposition to said first node;
    a first switch connected to be driven by said first node of said first oscillator, and connected so that said second node of said first oscillator is connected to said first node of said second oscillator when said first switch is turned on; and
    a second switch connected to be driven by said first node of said second oscillator, and connected so that said second node of said second oscillator is connected to said first node of said first oscillator when said second switch is turned on:
    wherein at least one node of said first oscillator is connected to provide a first clock signal, and the corresponding node of said second oscillator is connected to provide a second clock signal which does not overlap with said first clock signal.

2. The integrated circuit of claim 1, wherein at least one of said inverting digital gates is a Schmitt trigger.

3. The integrated circuit of claim 1, wherein at least one node of each said oscillator is connected to be held to a constant potential when a disable signal is active.

4. The integrated circuit of claim 1, wherein, when a disable signal is active, at least one node of each said oscillator is connected to be held to a constant potential, and wherein power is interrupted to at least one of said gates of each said oscillator.

5. The integrated circuit of claim 1, wherein each said oscillator comprises exactly three of said inverting digital gates.

6. The integrated circuit of claim 1, wherein each said coupling transistor consists essentially of an N-channel field-effect transistor.

7. The integrated circuit of claim 1, further comprising output buffer stages connected to receive and amplify said clock signals.

8. A CMOS integrated circuit for generating non-overlapping complementary clock signals, comprising:
first and second mutually matched ring oscillators, each comprising an odd number of inverting digital gates connected in a loop, at least one of said inverting gates of each said oscillator consisting of a simple CMOS inverter which is connected to be driven by a first node of said oscillator and configured to drive a second node of said oscillator in opposition to said first node;
at least one first NMOS coupling transistor connected to be driven by said first node of said first oscillator, and connected so that said second node of said first oscillator is connected to said first node of said second oscillator when said first transistor is turned on; and
a second NMOS coupling transistor connected to be driven by said first node of said second oscillator, and connected so that said second node of said second oscillator is connected to said first node of said first oscillator when said second transistor is turned on;
wherein at least one node of said first oscillator is connected to provide a first clock signal, and the corresponding node of said second oscillator is connected to provide a second clock signal which does not overlap with said first clock signal.

9. The integrated circuit of claim 8, wherein at least one of said inverting digital gates is a Schmitt trigger.

10. The integrated circuit of claim 8, wherein at least one node of each said oscillator is connected to be held to a constant potential when a disable signal is active.

11. The integrated circuit of claim 8, wherein, when a disable signal is active, at least one node of each said oscillator is connected to be held to a constant potential, and wherein power is interrupted to at least one of said gates of each said oscillator.

12. The integrated circuit of claim 8, wherein each said oscillator comprises exactly three of said inverting digital gates.

13. An integrated circuit on-chip high-voltage generator, comprising:
a voltage multiplier circuit, including two or more switches connected to be driven by first and second non-overlapping clock signals, and one or more capacitors interconnected with said switches to effect charge pumping; and
a clock generation circuit comprising:
first and second mutually matched ring oscillators, each comprising an odd number of inverting digital gates connected in a loop, at least one of said inverting gates of each said oscillator being connected to be driven by a first node of said oscillator and configured to drive a second node of said oscillator in opposition to said first node;
a first coupling transistor connected to be driven by said first node of said first oscillator, and connected so that said second node of said first oscillator is connected to said first node of said second oscillator when said first transistor is turned on; and
a second coupling transistor connected to be driven by said first node of said second oscillator, and connected so that said second node of said second oscillator is connected to said first node of said first oscillator when said second transistor is turned on;
wherein at least one node of said first oscillator is connected to provide said first clock signal, and the corresponding node of said second oscillator is connected to provide said second clock signal.

14. The integrated circuit of claim 13, wherein at least one of said inverting digital gates is a Schmitt trigger.

15. The integrated circuit of claim 13, wherein at least one node of each said oscillator is connected to be held to a constant potential when a disable signal is active.

16. The integrated circuit of claim 13, wherein, when a disable signal is active, at least one node of each said oscillator is connected to be held to a constant potential, and wherein power is interrupted to at least one of said gates of each said oscillator.

17. The integrated circuit of claim 13, wherein each said oscillator comprises exactly three of said inverting digital gates.

18. The integrated circuit of claim 13, wherein each said coupling transistor consists essentially of an N-channel field-effect transistor.

19. A non-overlapping phase, signal generator circuit comprising:
at least first and second loop oscillator circuits with cascaded inverters, each said oscillator circuit having first and second circuit nodes with at least one of said inverters connected therebetween, and
at least first and second switch circuit means, each having first and second terminals and a control terminal, the first switch circuit means being connected with its first and second terminals between the first circuit node of the first oscillator circuit and the second circuit node of the second oscillator circuit, the second switch circuit means being connected with its first and second terminals between the second circuit node of the first oscillator circuit and the first circuit node of the second oscillator circuit, the control terminal of the first switch circuit means and the control terminal of the second switch circuit means being respectively coupled to the first circuit node of the second oscillator circuit and the first circuit node of the first oscillator circuit.

20. A signal generator circuit according to claim 19, wherein at least one circuit node of each of the two oscillator circuits is connected to provide a signal output terminal.

21. A signal generator circuit according to claim 19, wherein said first and second switch circuit means are transistors.

22. A signal generator circuit according to claim 19, wherein said first and second switch circuit means are field-effect transistors having gate terminals respectively connected to the first circuit node of the second oscillator circuit and the first circuit node of the first oscillator circuit.

23. A signal generator circuit according to claim 19, integrated monolithically by CMOS technology.

24. A signal generator circuit according to claim 19, wherein an odd number of said inverters are connected between the first and the second circuit nodes of each oscillator circuit.

25. A signal generator circuit according to claim 19, wherein at least one of said inverters has a terminal connected to a reference voltage via a switch provided with a control terminal; and wherein, in each of said oscillator circuits, at least one said inverter has a disable terminal, the switch control terminal and the inverter disable terminals being connected to turn-off circuit means provided with a control terminal which is an input terminal of the signal generator circuit.

26. A non-overlapping phase, signal generator circuit comprising: at least first and second loop oscillators and at least first and second switch circuit means having control terminals respectively coupled to a first point in the signal path of the second loop oscillator and a first point in the signal path of the first loop oscillator, the second switch means being connected between the first point in the signal path of the second loop oscillator and a second point in the signal path of the first loop oscillator, whereat a signal has a different phase from the phase it has at the first point in the signal path of the first loop oscillator, the first switch means being connected between the first point in the signal path of the first loop oscillator and a second point in the signal path of the second loop oscillator, whereat a signal has a different phase from the phase it has at the first point in the signal path of the second loop oscillator.

27. A signal generator according to claim 26, wherein at least one point in the signal path of the first loop oscillator and at least one point in the signal path of the second loop oscillator is connected to provide signal output terminals.

28. A signal generator according to claim 26, wherein, within each loop oscillator, the phase value at said first point is substantially opposite to the phase value at said second point.

* * * * *